United States Patent
Suzuki et al.

(10) Patent No.: US 7,791,967 B2
(45) Date of Patent: Sep. 7, 2010

(54) SEMICONDUCTOR MEMORY DEVICE AND METHOD OF TESTING THE SAME

(75) Inventors: Takahiro Suzuki, Chigasaki (JP); Shinya Fujisawa, Hino (JP); Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 275 days.

(21) Appl. No.: 11/837,722

(22) Filed: Aug. 13, 2007

(65) Prior Publication Data

US 2008/0043553 A1 Feb. 21, 2008

(30) Foreign Application Priority Data

Aug. 16, 2006 (JP) ............... 2006-221991

(51) Int. Cl.
*G11C 29/12* (2006.01)

(52) U.S. Cl. .................... 365/201

(58) Field of Classification Search .......... 365/201
See application file for complete search history.

(56) References Cited

U.S. PATENT DOCUMENTS

| 6,243,307 | B1 * | 6/2001 | Kawagoe ............. 365/201 |
| 6,275,960 | B1 | 8/2001 | Cappelletti et al. |
| 6,366,508 | B1 * | 4/2002 | Agrawal et al. ............. 365/200 |
| 6,421,286 | B1 * | 7/2002 | Ohtani et al. ............. 365/200 |
| 7,372,750 | B2 * | 5/2008 | Poechmueller ............. 365/200 |
| 2005/0063230 | A1 * | 3/2005 | Seitoh ............. 365/201 |
| 2006/0291308 | A1 | 12/2006 | Yusa |
| 2007/0016826 | A1 * | 1/2007 | Dubey ............. 714/30 |

FOREIGN PATENT DOCUMENTS

JP 2006-85769 3/2006

* cited by examiner

*Primary Examiner*—Hoai V Ho
*Assistant Examiner*—Jay Radke
(74) *Attorney, Agent, or Firm*—Oblon, Spivak, McClelland, Maier & Neustadt, L.L.P.

(57) ABSTRACT

A semiconductor memory device includes a semiconductor memory, an auto-operation control circuit which outputs a clock signal, a sync read control circuit which outputs a sync read address in sync with the clock signal, a read control circuit which selects a read address of the semiconductor memory in accordance with an address of the sync read address, a read sense amplifier circuit which outputs a data read signal that is produced by sensing data that is read out of the semiconductor memory in accordance with the read address, and a determination circuit which compares the data read signal with an expectation value.

11 Claims, 10 Drawing Sheets

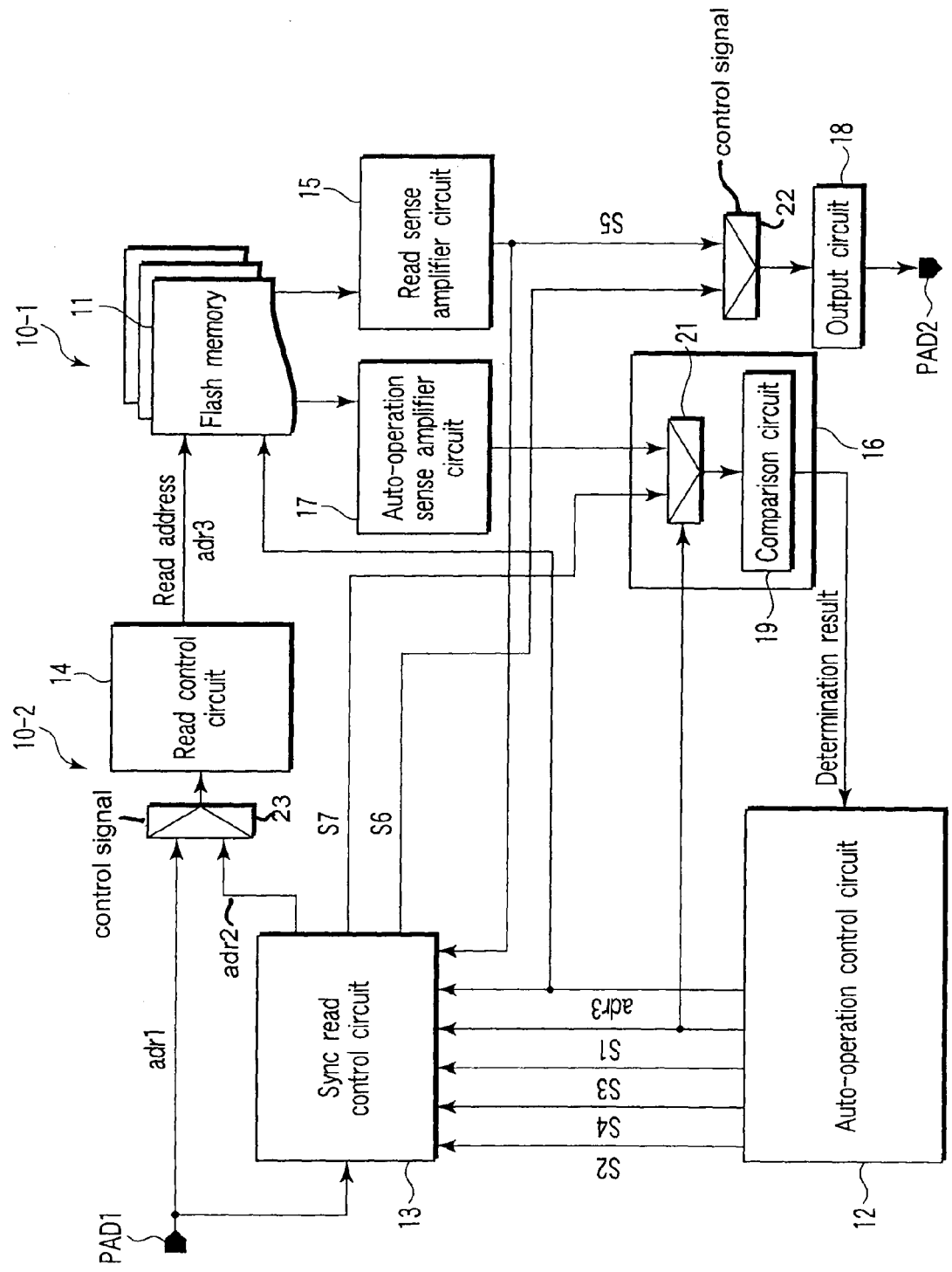
F I G. 1

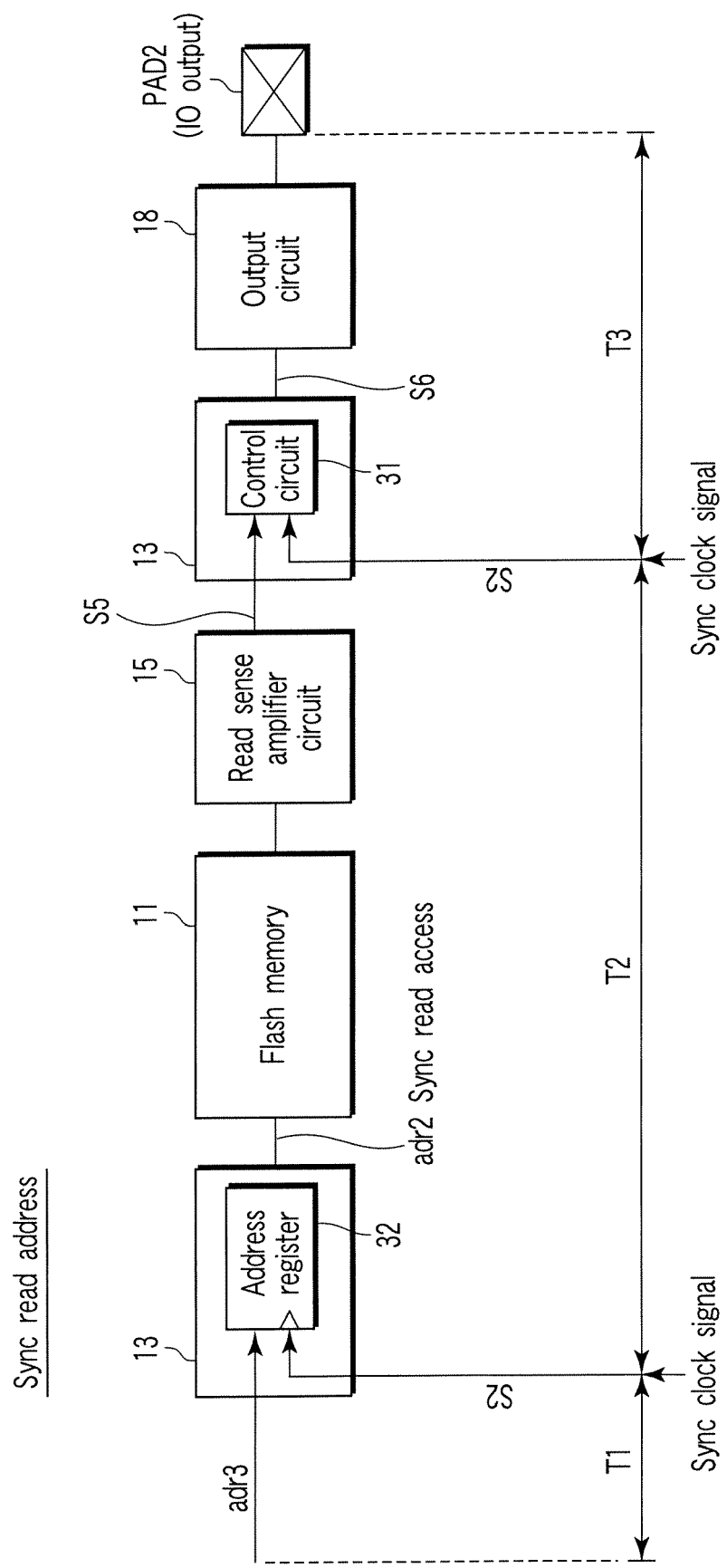
F I G. 6

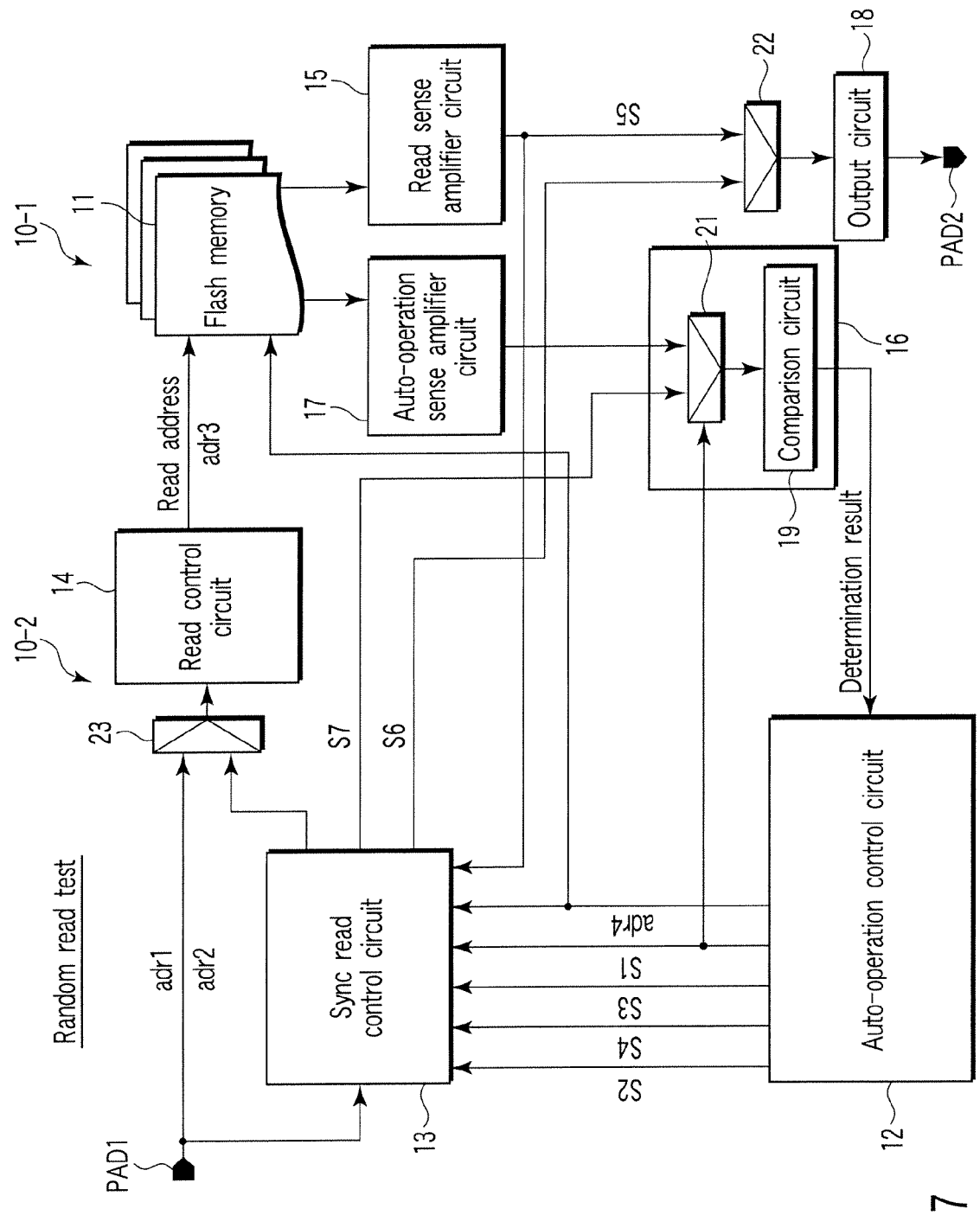
F I G. 7

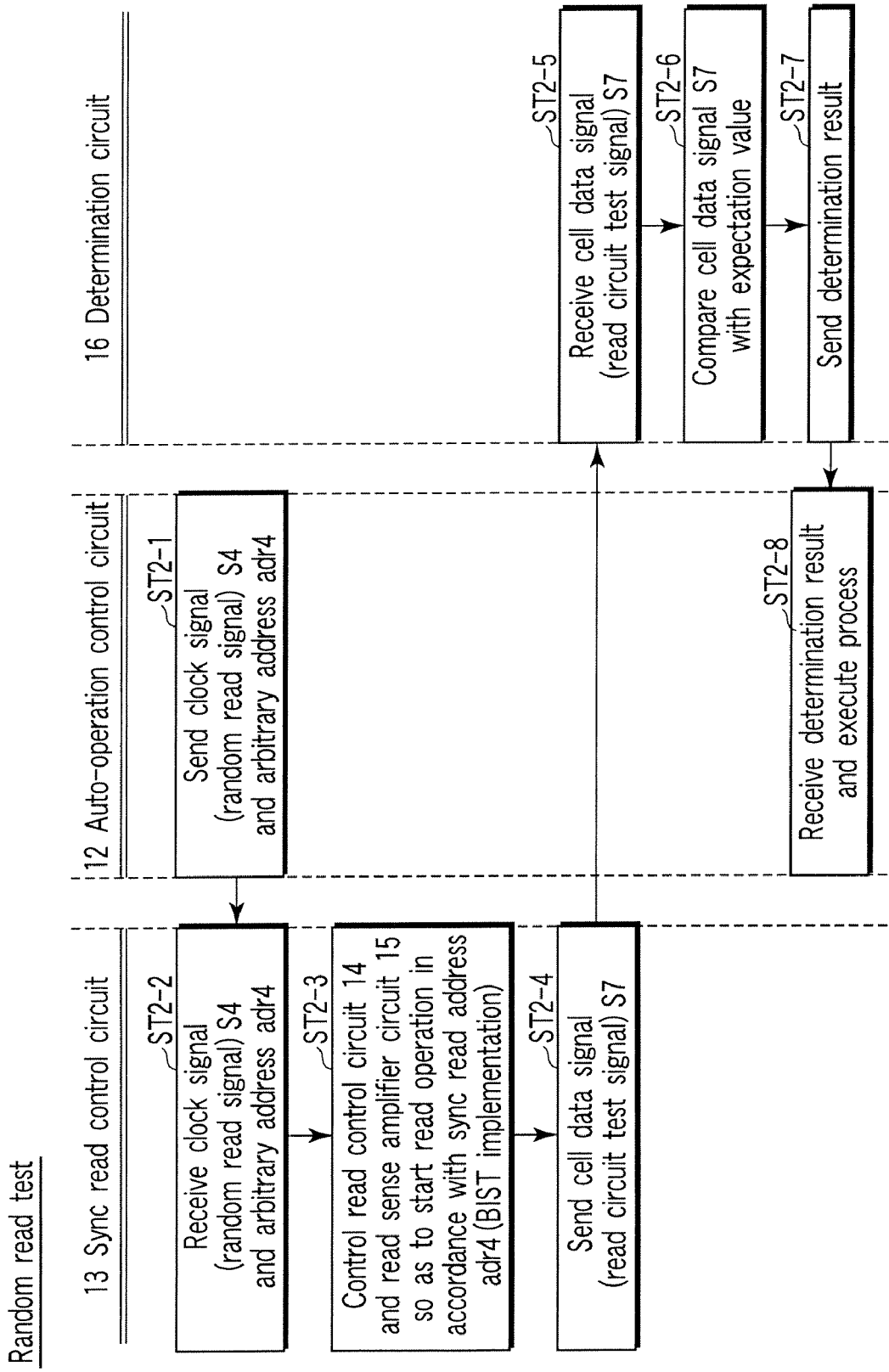
F I G. 9

SEMICONDUCTOR MEMORY DEVICE AND METHOD OF TESTING THE SAME

CROSS-REFERENCE TO RELATED APPLICATIONS

This application is based upon and claims the benefit of priority from prior Japanese Patent Application No. 2006-221991, filed Aug. 16, 2006, the entire contents of which are incorporated herein by reference.

BACKGROUND OF THE INVENTION

1. Field of the Invention

The present invention relates generally to a semiconductor memory device and a test method of the same, and the invention is applied, for example, to a memory chip in which a NOR flash memory is mounted.

2. Description of the Related Art

Conventionally, in a semiconductor memory device such as a memory chip in which a NOR flash memory is mounted, it is necessary to conduct a screening test to determine whether the flash memory can normally function or not (see, e.g. Jpn. Pat. Appln. KOKAI Publication No. 2006-85769). However, this screening test requires a very long time with respect to one memory chip (1 chip), leading to an increase in cost. To avoid this problem, a BIST test, which is implemented by BIST (Built-In Self-Test), is performed to carry out the screening test by a test circuit that is built in the memory chip itself. The BIST is a methodology in which a scheme (hereinafter referred to as "test circuit") for testing a to-be-tested object is activated by a trigger (e.g. a command) that is delivered from an external input provided in the to-be-tested object, and a determination result of the test can be received by an external output provided in the to-be-tested object. In other words, the BIST refers to the scheme for executing a self-test and an interface that makes use of this scheme.

The test circuit includes circuits of a read operation system for inputting an address and reading cell data, and circuits of an auto-operation system for inputting a command and executing a write operation and an erase operation in the flash memory. Moreover, in the circuits of the read operation system and the circuits of the auto-operation system, a control circuit and a sense amplifier circuit are independently controlled. This is intended to enable read-out ("dual read") of a block which is different from a block that is the object of the auto-operation.

However, at the time of the BIST test, write/erase of a semiconductor memory is executed by an auto-operation control circuit, and a read operation (verify operation) is executed by an auto-operation sense amplifier circuit, thereby carrying out read-out of cell data and screening of a chip. In other words, at the time of the BIST test, the screening test is performed only by the circuits (auto-operation control circuit and auto-operation sense amplifier circuit) of the auto-operation system.

For this reason, in the conventional screening test, the circuits of the read operation system, namely, a read control circuit and a read sense amplifier circuit, could not be implemented by the BIST scheme. Hence, even in a case where a circuit defect occurs in the circuits of the read operation system, it is not possible to screen the read control circuit and read sense amplifier circuit. As a result, as regards the screening of the read control circuit and read sense amplifier circuit, another test needs to be performed in a subsequent step of the BIST test, leading to an increase in test time and test cost.

BRIEF SUMMARY OF THE INVENTION

According to an aspect of the present invention, there is provided a semiconductor memory device comprising: a semiconductor memory; an auto-operation control circuit which outputs a clock signal; a sync read control circuit which outputs a sync read address in sync with the clock signal; a read control circuit which selects a read address of the semiconductor memory in accordance with an address of the sync read address; a read sense amplifier circuit which outputs a data read signal that is produced by sensing data that is read out of the semiconductor memory in accordance with the read address; and a determination circuit which compares the data read signal with an expectation value.

According to another aspect of the present invention, there is provided a test method of a semiconductor memory device including a semiconductor memory, an auto-operation control circuit, a sync read control circuit, a read control circuit, a read sense amplifier circuit and a determination circuit, the test method comprising: causing the auto-operation control circuit to output a clock signal; causing the sync read control circuit to output, upon receiving the clock signal, a retained address as a sync read address in sync with the clock signal; causing the read control circuit to select, upon receiving the sync read address, a read address of the semiconductor memory in accordance with an address of the sync read address; causing the read sense amplifier circuit to output a data read signal which is produced by sensing data that is read out in accordance with the read address; causing the sync read control circuit to retain the data read signal and to output the data read signal as a test data signal to the determination circuit in sync with the clock signal; and causing the determination circuit to compare the test data signal with an expectation value and to output a determination result to the auto-operation control circuit.

BRIEF DESCRIPTION OF THE SEVERAL VIEWS OF THE DRAWING

FIG. 1 is a block diagram showing a semiconductor memory device according to a first embodiment of the present invention;

FIG. 6 is a view for explaining a sync read access of the semiconductor memory device according to the first embodiment;

FIG. 7 is a block diagram showing a semiconductor memory device according to a second embodiment of the present invention;

FIG. 9 is a flow chart illustrating a random read test method of the semiconductor memory device according to the second embodiment.

DETAILED DESCRIPTION OF THE INVENTION

Figure 2:
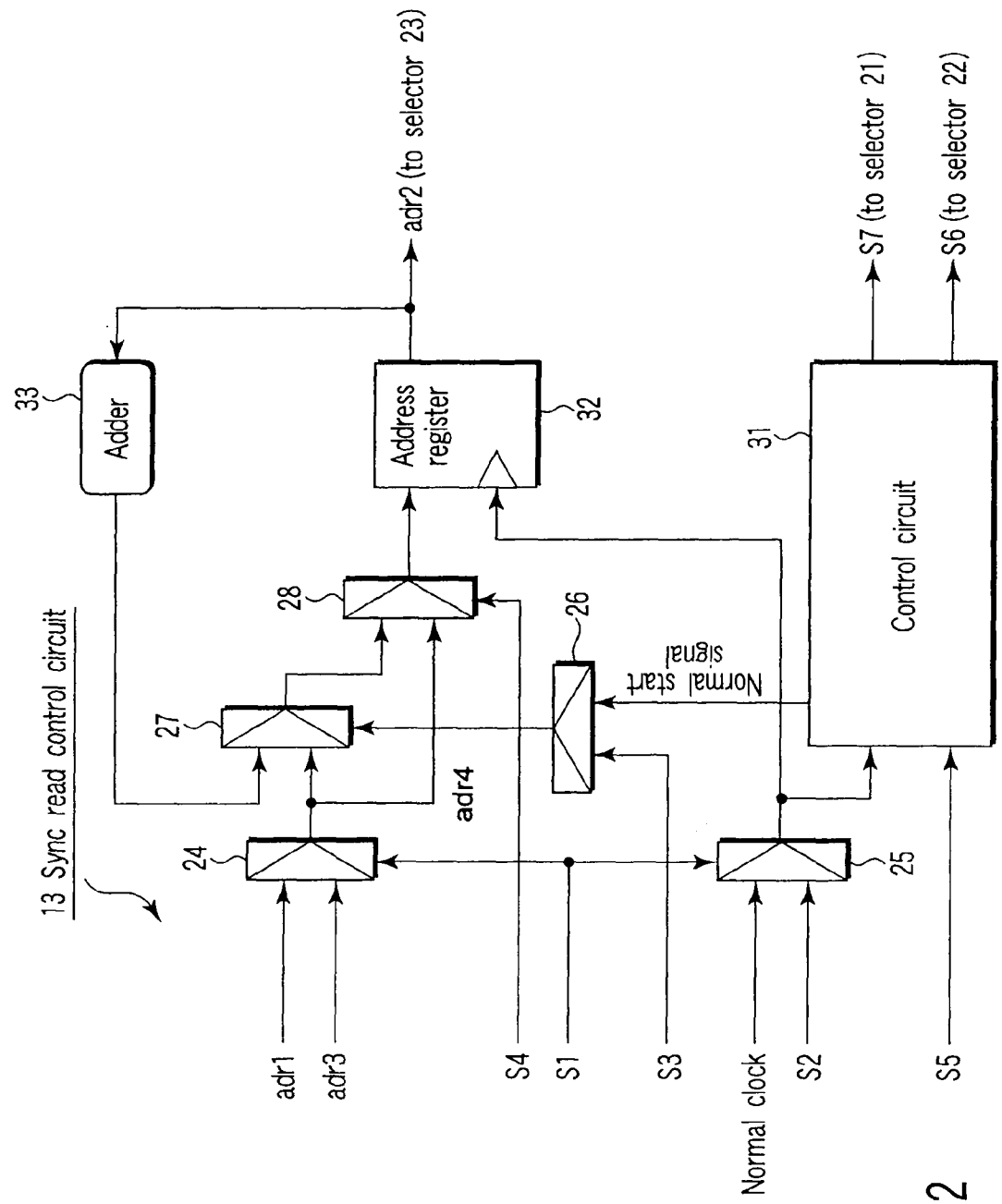
FIG. 2 is a circuit diagram showing a sync read control circuit shown in FIG. 1.

Embodiments of the present invention will now be described with reference to the accompanying drawings. In the description below, common parts are denoted by like reference numerals throughout the drawings.

First Embodiment (An Example in Which a Sync Read Control Circuit is Used and a Control Circuit and a Read Operation Sense Amplifier Circuit of a Read Operation System are Configured by BIST Implementation, Thus Carrying Out a Screening Test)

To begin with, referring to FIG. 1 and FIG. 2, a semiconductor memory device according to a first embodiment of the invention is described. FIG. 1 is a block diagram showing the semiconductor memory device according to this embodiment. FIG. 2 is a circuit diagram showing a sync read control circuit 13 shown in FIG. 1.

As is shown in FIG. 1 and FIG. 2, the semiconductor memory device according to the embodiment is a memory chip comprising a memory unit 10-1, and a test circuit unit 10-2 which tests the memory unit 10-1.

The memory unit 10-1 includes a plurality of flash memories 11. In the case of this embodiment, the flash memory 11 is a NOR flash memory. The NOR flash memory includes a plurality of memory cell transistors which are disposed in a matrix at intersections between word lines and bit lines. In the NOR flash memory, since the memory cell transistors are provided at the intersections of the lines for write, as described above, random access can be executed unlike the case of a NAND flash memory.

Each of the memory cell transistors has a stacked structure including a floating electrode that is provided on a semiconductor substrate, an inter-electrode insulation film provided on the floating electrode, and a control electrode provided on the inter-electrode insulation film.

The test circuit unit 10-2 is assembled in a hybrid fashion with the flash memories 11. The test circuit unit 10-2 is provided in order to perform a BIST test which is implemented by BIST (Built-In Self-Test) so that a screening test of the flash memory 11 may be conducted by the assembled test circuit unit 10-2 itself.

The test circuit unit 10-2 includes an address pad PAD1, an I/O pad PAD2, an auto-operation control circuit 12, a sync read control circuit 13, a read control circuit 14, a read sense amplifier circuit 15, a determination circuit 16, an auto-operation sense amplifier circuit 17, and selectors 21 to 23.

A non-sync read address adr1 is input to the address pad PAD1.

The auto-operation control circuit 12 is configured to output a predetermined signal, such as a test clock signal S2, to the sync read control circuit 13 at the time of the BIST test of a read operation (to be described later), thereby driving the sync read control circuit 13.

The sync read control circuit 13 is configured to receive, e.g. the test clock signal S2 at the time of the BIST test of the read operation, and to output the sync read address adr2 to the read control circuit 14, thereby controlling the read control circuit 14 and read sense amplifier circuit 15.

The read control circuit 14 is configured to select a read address of the flash memory 11 in accordance with the address of the received sync read address adr2.

The read sense amplifier circuit 15 is configured to sense data that is read out of the flash memory 11 in accordance with the address of the sync read address adr2, and to send the sensed data, as a cell data read signal S5, to the selector 22 or to the sync read control circuit 13.

The determination circuit 16 includes a selector 21 and a comparison circuit 19, and compares a read circuit test data signal S7 which is sent from the sync read control circuit 13, or a test data signal which is sent from the auto-operation sense amplifier 17, with a predetermined expectation value, thereby outputting a comparison determination result to the auto-operation control circuit 12.

If a read circuit test signal S1 is input to a control terminal of the selector 21, the selector 21 executes switching between the test data signal, which is output from the auto-operation sense amplifier 17, and the read circuit test data signal S7, and outputs the switched signal to the comparison circuit 19. The comparison circuit 19 compares one of the read circuit test data signal S7 and the test data signal, which is output from the auto-operation sense amplifier 17, with a predetermined expectation value, and outputs a comparison determination result to the auto-operation control circuit 12.

The auto-operation sense amplifier circuit 17 is configured to sense the data that is read out from the flash memory in accordance with the address of the auto-operation address adr3, and to sends the auto-operation read signal to the determination circuit 16.

The selector 22 is configured to switch one of the cell data read signal S5 and a sync read data signal S6, which are input to input terminals of the selector 22, in accordance with a control signal that is input to a control terminal of the selector 22, and to output the switched signal to the output circuit 18.

The selector 23 is configured to switch one of the non-sync read address adr1 and sync read address adr2, which are input to input terminals of the selector 23, in accordance with a control signal that is input to a control terminal of the selector 23, and to output the switched address to the read control circuit 14.

Next, referring to FIG. 2, the structure of the sync read control circuit 13 is described in greater detail.

As shown in FIG. 2, the sync read control circuit 13 includes a control circuit 31, an address register 32, an adder 33, and selectors 24 to 28.

The control circuit 31 is configured to synchronize, upon receiving the test clock signal S2 and the cell data read signal S5, and outputs the synchronized signal, as the read circuit test data signal S7 or sync read data signal S6, to the determination circuit 16 or the selector 22, respectively.

The address register 32 is configured to output the retained non-sync read address adr1 or auto-operation address adr3 to the selector 23 as the sync read address adr2 at a timing of (i.e. in sync with) the reception of a normal clock or test clock signal S2.

The adder 33 is configured to add one address to the address that is input from the address register 32, and to output the added address to the selector 27.

The selector 24 is configured to output the auto-operation address adr3 to input terminals of the selectors 27 and 28, upon receiving the non-sync read address adr1 or auto-operation address adr3 at its input terminal and receiving the read circuit test signal S1 at its control terminal.

The selector 25 is configured to output the test clock signal S2 to the control circuit 31 and address register 32, upon receiving the ordinary clock or test clock signal S2 at its input terminal and the read circuit test signal S1 at its control terminal.

The selector 26 is configured to output a test start signal S3 to the control terminal of the selector 27, upon receiving a normal start signal or the test start signal S3 at its input terminal and receiving a control signal at its control terminal.

The selector 27 outputs the output address of the selector 24 when the output address of the selector 24 or the output address of the adder 33 is input to the input terminal of the selector 27 and the output signal of the selector 26, which is input to the control terminal of the selector 27, is "1" (Enable). On the other hand, the selector 27 outputs the output address of the adder 33 when the output signal of the selector 26 is "0".

The selector 28 is configured to output the output address (arbitrary address adr4) to the address register 32, if the output address of the selector 27 or the output address (arbitrary address adr4) of the selector 24 is input to the input terminal of the selector 28 and a random read signal S4 is input to the control terminal at the time of a random read test (to be described later).

<Read Test Method>

Figure 3:
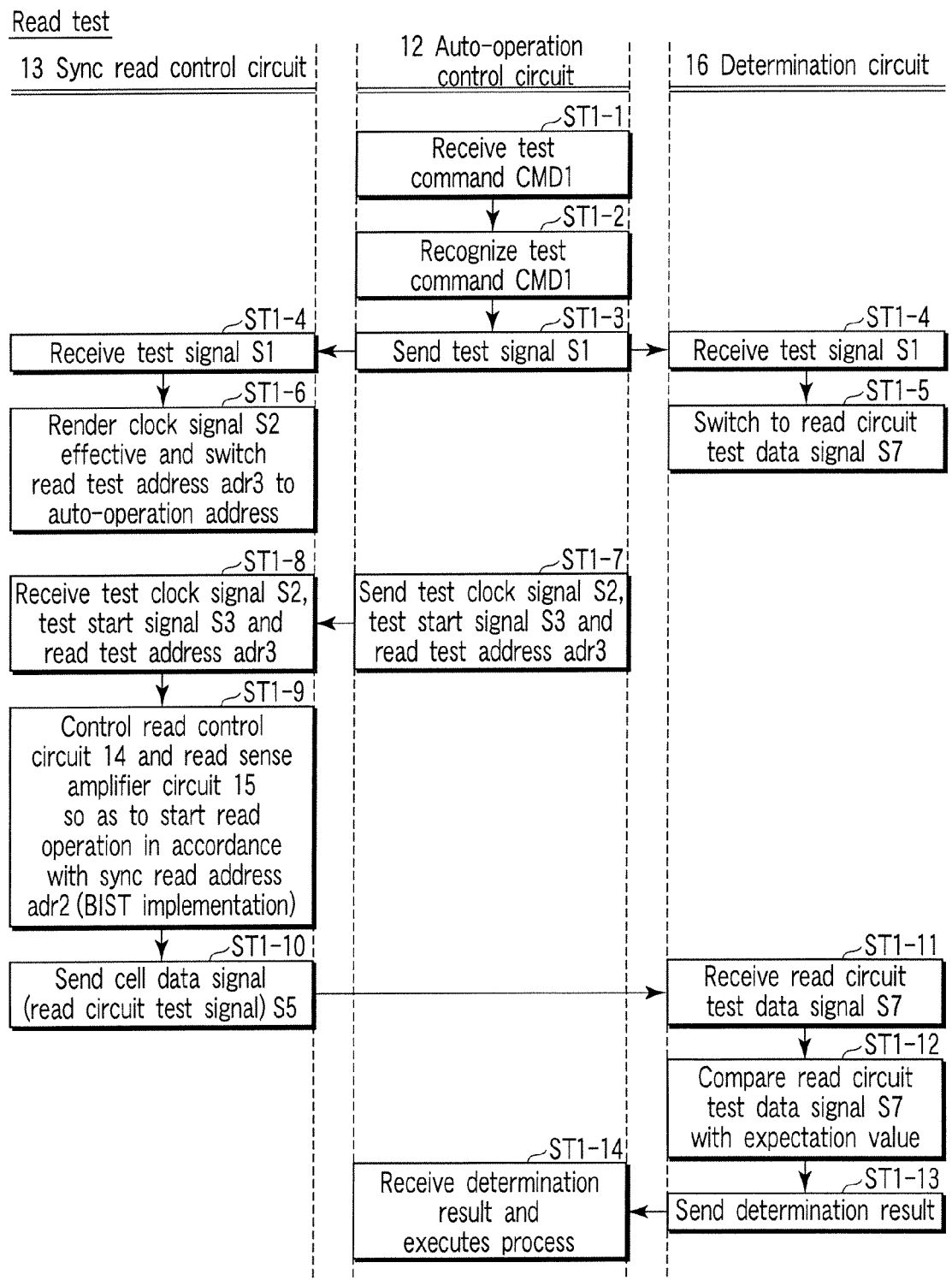
FIG. 3 is a flow chart illustrating a read test method of the semiconductor memory device according to the first embodiment.
Figure 4:
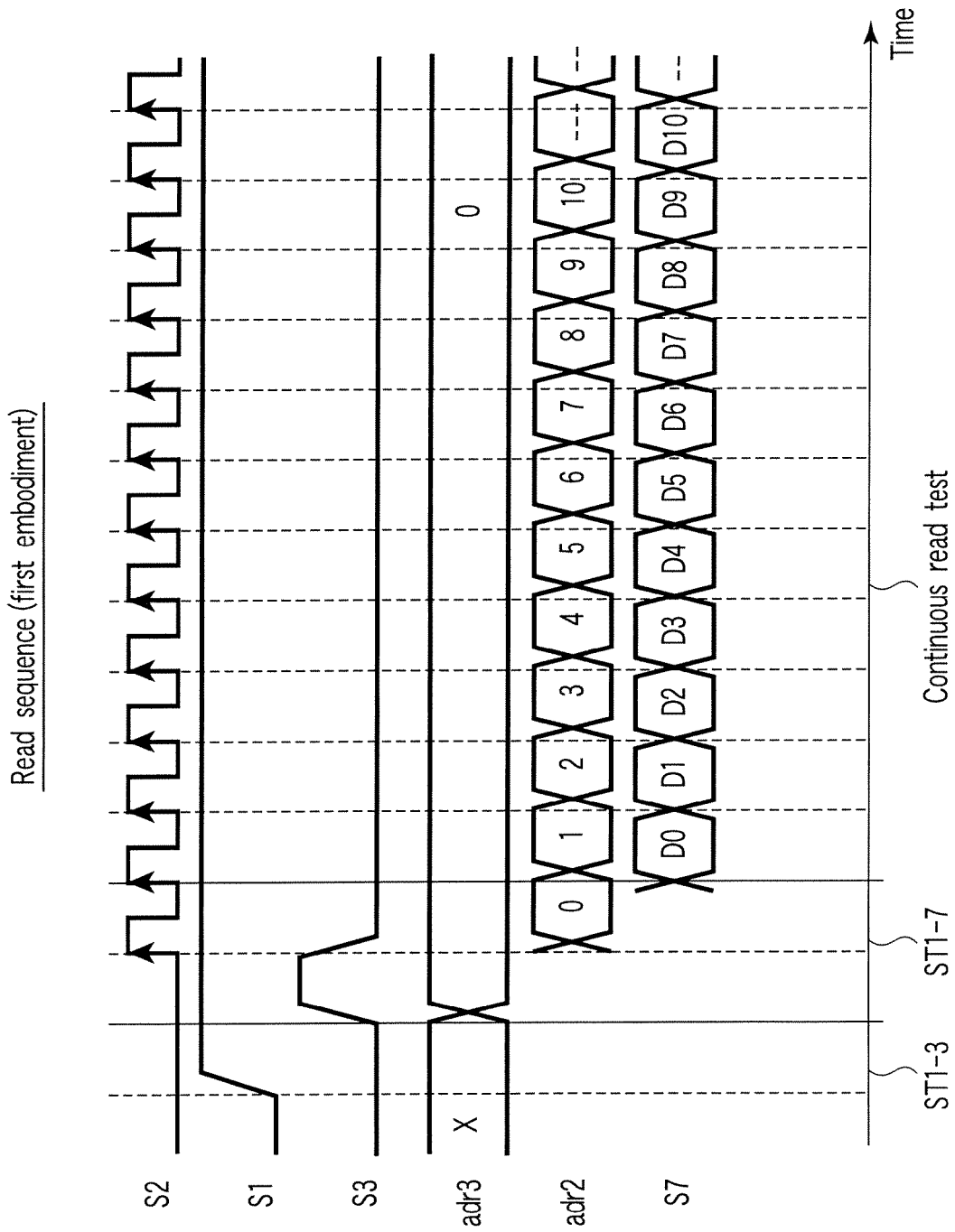
FIG. 4 shows a read sequence of the semiconductor memory device according to the first embodiment.

Next, referring to a flow chart of FIG. 3 and a read sequence of FIG. 4, a description is given of a read test method of the semiconductor memory device according to the present embodiment. The read test method according to this example relates to a method of performing a screening test of the read control circuit 14 and read operation sense amplifier circuit 15 by controlling the read control circuit 14 and read operation sense amplifier circuit 15 of the read operation system by BIST implementation by means of the sync read control circuit 13.

(Step ST1-1, ST1-2)

To start with, the auto-operation control circuit 12 receives a test command CMD1 from outside.

Upon receiving the test command CMD1, the auto-operation control circuit 12 recognizes this command CMD1.

(Step ST1-3)

Then, upon recognizing the command CMD1, the auto-operation control circuit 12 sends the read circuit test signal S1 to the sync read control circuit 13 and to the determination circuit 16.

(Step ST1-4, ST1-5)

If the determination circuit 16 receives the read circuit test signal S1, the received read circuit test signal S1 is input to the control terminal of the selector 21. Accordingly, the selector 21 switches the output to the comparison circuit 19 from the output signal of the auto-operation sense amplifier 17 to the read circuit test data signal S7 that is output from the sync read control circuit 13.

Subsequently, the comparison circuit 19 receives the read circuit test data signal S7 and compares this signal S7 with the expectation value.

(Step ST1-4, ST1-6)

If the sync read control circuit 13 receives the read circuit test signal S1, the read circuit test signal S1 is input, as shown in FIG. 2, to the control terminals of the selectors 24 and 25 that are included in the sync read control circuit 13.

Thus, the sync clock is rendered effective as the test clock signal S2 that is input from the auto-operation control circuit 12 in a subsequent step (ST1-9). Further, the read test address is switched from the non-sync read address adr1 to the auto-operation address adr3 which is input in the subsequent step (ST1-9).

(Step ST1-7)

Subsequently, the auto-operation control circuit 12 outputs the test clock signal S2, test start signal S3 and auto-operation address (read test address) adr3 to the sync read control circuit 13.

(Step ST1-8)

Subsequently, the sync read control circuit 13 receives the test clock signal S2, test start signal S3 and auto-operation address (read test address) adr3, and recognizes the signals S2 and S3 and the address adr3.

At this time, as shown in FIG. 2, the read circuit test signal S1 is input to the control terminals of the selectors 24 and 25 that are included in the sync read control circuit 13. Thus, since the output of the selector 24 is switched to the auto-operation address adr3, the auto-operation address adr3 is input to the address register 32. Further, since the output of the selector 25 is switched to the test clock signal S2, the test clock signal S2 is input to the control circuit 31.

(Step ST1-9)

Subsequently, the sync read control circuit 13 selects the address of the flash memory 11 to be the sync read address adr2 that is sent, and controls the read control circuit 14 so as to start the read operation.

Further, the sync read control circuit 13 controls the read operation sense amplifier circuit 15 so as to sense the memory cell data of the flash memory 11, which is read out in accordance with the sync read address adr2, and to send the sensed data as the cell data read signal S5 to the sync read control circuit 13 and selector 22.

As described above, the sync read control circuit 13 can control the circuits (read control circuit 14 and read operation sense amplifier circuit 15) of the read operation system so as to start the read operation in accordance with the generated sync address adr2, and can execute the read test (self-test implementation, BIST implementation).

(Step ST1-10)

Subsequently, the sync read control circuit 13 synchronizes, by the control circuit 31 provided in the circuit 13, the cell data read signal S5 which is sent from the read operation sense amplifier circuit 15, and outputs the read circuit test data signal S7 and the sync read data signal S6.

Further, the sync read control circuit 13 sends the converted read circuit test data signal S7 to the determination circuit 16, and sends the converted sync read data signal S6 to the output circuit 18.

(Step ST1-11)

Subsequently, the determination circuit 16 receives the read circuit test data signal S7.

(Step ST1-12)

Subsequently, the determination circuit 16 compares, by means of the comparison circuit 19, the read circuit test data signal S7, which is output from the selector 21, with a predetermined expectation value, thereby carrying out faulty/non-faulty determination.

(Step ST1-13)

Subsequently, the determination circuit 16 sends a faulty/non-faulty determination result to the auto-operation control circuit 12.

(Step ST1-14)

Subsequently, the auto-operation control circuit 12 receives the determination result of the determination circuit 16 and executes a predetermined process. Specifically, in the case where the auto-operation control circuit 12 receives the determination result of "non-faulty", the auto-operation control circuit 12 recognizes that the memory cell of the flash memory 11, which corresponds to the read address, is a good cell. On the other hand, in the case where the auto-operation control circuit 12 receives the determination result of "faulty", the auto-operation control circuit 12 recognizes that the memory cell of the flash memory 11, which corresponds to the read address, is a defective cell, and replaces the defective cell with a relief memory cell.

By the above-described steps ST1-1 to ST1-14, the read test of the semiconductor memory device according to this example is carried out.

<Example of a Continuous Read Test Method>

Next, a description is given of a continuous read test method of the semiconductor memory device according to this embodiment.

As shown in FIG. 2, after the above-described step ST1-14, the auto-operation control circuit 12 continues to output the test signal S1 and test clock signal S2 to the sync read control circuit 13.

Subsequently, the sync read control circuit 13 executes the above-described same steps ST1-10 and ST1-11 by the sync read address adr2 of the address that is progressed by means of the adder (address counter circuit) 33, controls the read control circuit 14 and read sense amplifier 15, and executes read-out of the memory 11.

Subsequently, the determination circuit 16 executes the above-described same steps ST1-12 to ST1-14, and sends the determination result to the sync read control circuit 13.

Subsequently, the sync read control circuit 13 receives the determination result of the determination circuit 16 and executes the same process as described above.

As stated above, as long as the auto-operation control circuit 12 sends the test clock signal S2, the sync read control circuit 13 can, by repeating the above-described steps, continue the determination process on the basis of the address that is progressed by one, with use of the address counter function of the adder 33.

As has been described above, the following advantageous effects (1) to (3) can be obtained by the semiconductor memory device and the test method thereof according to the present embodiment.

(1) The test time and test cost can be reduced.

As described above, the auto-operation control circuit 12 according to this embodiment generates the test clock signal S2, test start signal S3 and auto-operation address adr3, and sends them to the sync read control circuit 13 (steps ST1-7).

Further, the sync read control circuit 13 includes the selectors 25, 24 and 26. Thus, in the subsequent step ST1-8, the read circuit test signal S1 is input to the control terminals 24 and 25 of the sync read control circuit 13. Hence, in the selector 24, the output is switched to the auto-operation address adr3, and the auto-operation address adr3 is input to the address register 32. Further, in the selector 25, the output is switched to the test clock signal S2, and the test clock signal S2 is input to the control circuit 31.

In this manner, the read circuit test signal S1 is input to the control terminals of the selectors 24 and 25, and thereby the outputs of the selectors 24 and 25 are switched to the auto-operation address adr3 and test clock signal S2, respectively. Subsequently, the test start signal S3 is output to the selector 26, and thereby the auto-operation address adr3 is input to the address register 32 and temporarily stored in the address register 32. At the timing of (i.e. in sync with) the test clock signal S2 of the output signal of the selector 25, a predetermined sync read address adr2 can be generated from the address register 32.

Subsequently, the sync read control circuit 13 selects the address of the flash memory 11 in accordance with the sync read address adr2 that is sent, and controls the read control circuit 14 so as to start the read operation. Further, the sync read control circuit 13 controls the read sense amplifier circuit 15 so as to sense the memory cell data of the flash memory 11 which is read out in accordance with the sync read address adr2, and to send the read-out memory cell data as the cell data read signal S5 to the sync read control circuit 13 and the selector 22 (step ST1-9).

Then, the determination circuit 16 compares the read circuit test data signal S7, which is read out, with the predetermined expectation value (step ST1-12), the auto-operation control circuit 12 executes the predetermined process on the basis of the determination result of the determination circuit 16 (step ST1-14), and thus the read test operation is completed.

In this manner, the sync read control circuit 13 can control the circuits (read control circuit 14 and read operation sense amplifier circuit 15) of the read operation system so as to start the read operation in accordance with the generated sync address adr2, and can execute the read test (self-test implementation, BIST implementation).

Accordingly, even in the case where a circuit defect occurs in the circuits of the read operation system, it is possible to perform screening of the read control circuit 14 and read sense amplifier circuit 15 at the time of the screening test (BIST test), and there is no need to perform an additional test in a subsequent step of the BIST test.

As a result, the memory chip including many read-operation-related circuits at a time, the number of test operations that are executed at the same time can be increased, and the amount of transactions with the tester can be reduced. Therefore, the test time and test cost can be reduced.

For example, in the case of the present embodiment, the number of memory chips that can be tested at a time can be increased from about several tens to about 400. Accordingly, in the case of this embodiment, the test time can be reduced by three orders of magnitude (1000 times), for example, from milliseconds (ms) to micro-seconds (μs). As described above, since the test time can greatly be reduced, a manufacturing cost of, e.g. several hundred million yen, can be saved.

If the screening test can be executed by configuring the circuits (read control circuit 14 and read operation sense amplifier circuit 15) of the read operation circuit by BIST implementation (i.e. self-test implementation), the test time and the test cost can be advantageously reduced.

In the screening test of the flash memory 11, it is necessary to execute, with respect to each of chips, screening of many fault modes such as write characteristic abnormality, erase characteristic abnormality, retention (charge retention) defect, endurance (repeated rewrite) defect, disturb defect and fabrication process defect. However, in order to execute screening of these fault modes, it is necessary to actually execute write/erase in the flash memory 11, to apply a stress of charge to the memory cells and transistors for a long time, and to read cell data by executing a read operation. However, if the BIST implementation is adopted, many memory chips can be subjected to the screening test at a time.

(2) The operation delay of the memory 11 can be prevented.

Figure 5:
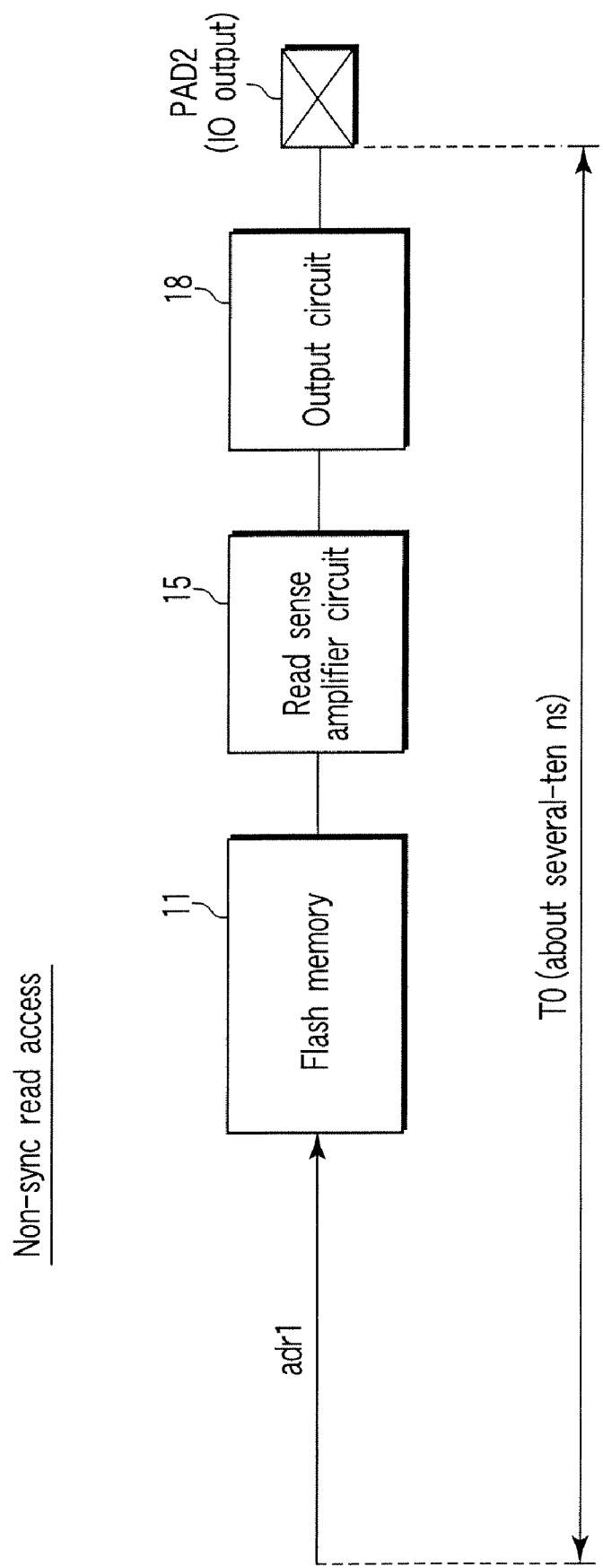
FIG. 5 is a view for explaining a non-sync read access.

In the read test of this embodiment, use is made of not a non-sync read access path shown in FIG. 5, but a sync read access path shown in FIG. 6. Thus, the operation delay of the flash memory 11 can be prevented.

In the non-sync read access path shown in FIG. 5, if the non-sync read address adr1 is sent to the flash memory 11, the read test data is sensed by the read operation sense amplifier circuit 15 and the sensed data is output as an IO output from the output circuit 18 to the pad PAD2. In the non-sync read access path, continuous read is necessary. If a test circuit is inserted in this path, a delay may occur in the non-sync read access. For example, the access time T0 of this path is about several-ten ns.

On the other hand, as shown FIG. 6, the read path of the read test method according this embodiment is the sync read access path. As shown in FIG. 6, in this sync read path, the auto-operation read address adr3 that is sent to the sync read control circuit 13 is once retained in the address register 32, and is sent to the flash memory 11 as the sync read address adr2 at the timing of (i.e. in sync with) the input of the test clock signal S2 to the address register 32.

Subsequently, the cell data read signal S5 that is sensed by the read sense amplifier circuit 15 is once retained in the control circuit 31 that is provided in the sync read control circuit 13, and is sent to the output circuit 18 as the sync read data signal S6 at the timing of (i.e. in sync with) the input of the test clock signal S2 to the control circuit 31.

Hence, in this sync read access path of this embodiment, it should suffice to output the signals, which are retained in the address register 32 and control circuit 31 at the timing of the sync clock signal (test clock signal S2), and continuous read is not necessary. Therefore, the access times T1, T2 and T3 of the entire access path can apparently be separated.

As described above, a delay in operation of the flash memory 11 can be prevented by disposing the access path of the circuits (read control circuit 14 and read sense amplifier circuit 15) of the read operation system on the sync read access path that is not the critical path for operation frequencies.

(3) A continuous read test can be conducted.

The sync read control circuit 13 according to this embodiment includes the adder 33 having its input connected to the output of the address register 32.

Thus, the sync read control circuit 13 can execute, by the address counter function of the adder 33, the above-described steps ST1-10 and ST1-11 on the basis of the sync address adr2 of the progressed address, can control the read control circuit 14 and read sense amplifier 15, and can execute read-out of the memory 11.

As described above, as long as the auto-operation control circuit 12 is sending the test clock S2, the sync read control circuit 13 can continuously perform the determination process based on the address that is progressed by one, by repeating the above-described steps, and can perform the continuous read test, as needed.

Second Embodiment (an Example of the Random Read Test Method)

Next, a semiconductor memory device according to a second embodiment of the invention is described with reference to FIG. 7 and FIG. 8. This embodiment relates to an example of the random read test method of the semiconductor memory device. A detailed description of the parts common to those in the first embodiment is omitted here.

Figure 8:
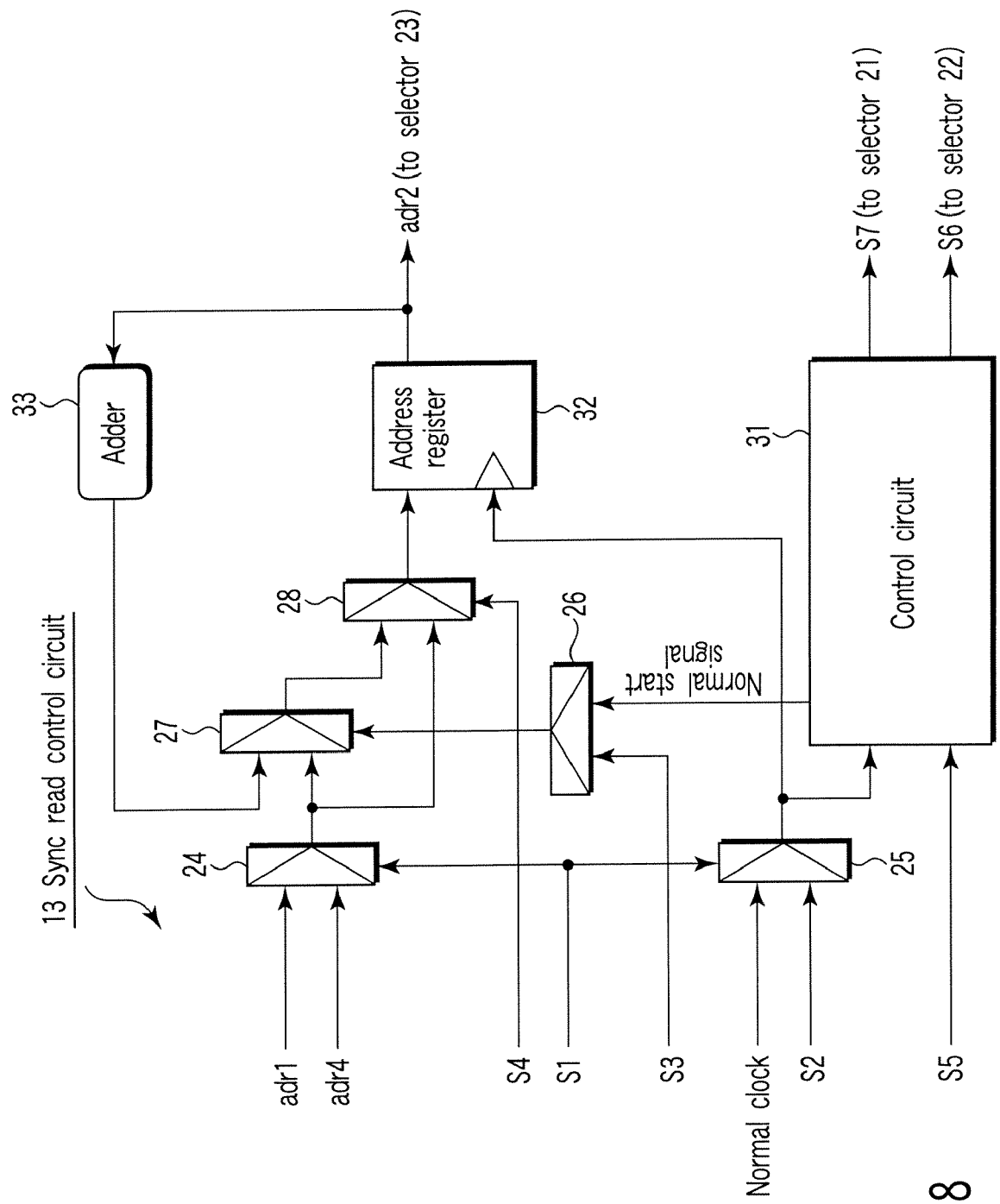
FIG. 8 is a circuit diagram showing a sync read control circuit shown in FIG. 7.

As shown in FIG. 7 and FIG. 8, the semiconductor memory device of the second embodiment differs from that of the first embodiment in that an arbitrary address adr4, instead of the auto-operation address adr3, is sent from the auto-operation control circuit 12 to the sync read control circuit 13. The random read signal S4 is a signal that is used in a random read test which is to be described below.

<Random Read Test Method>

Figure 10:
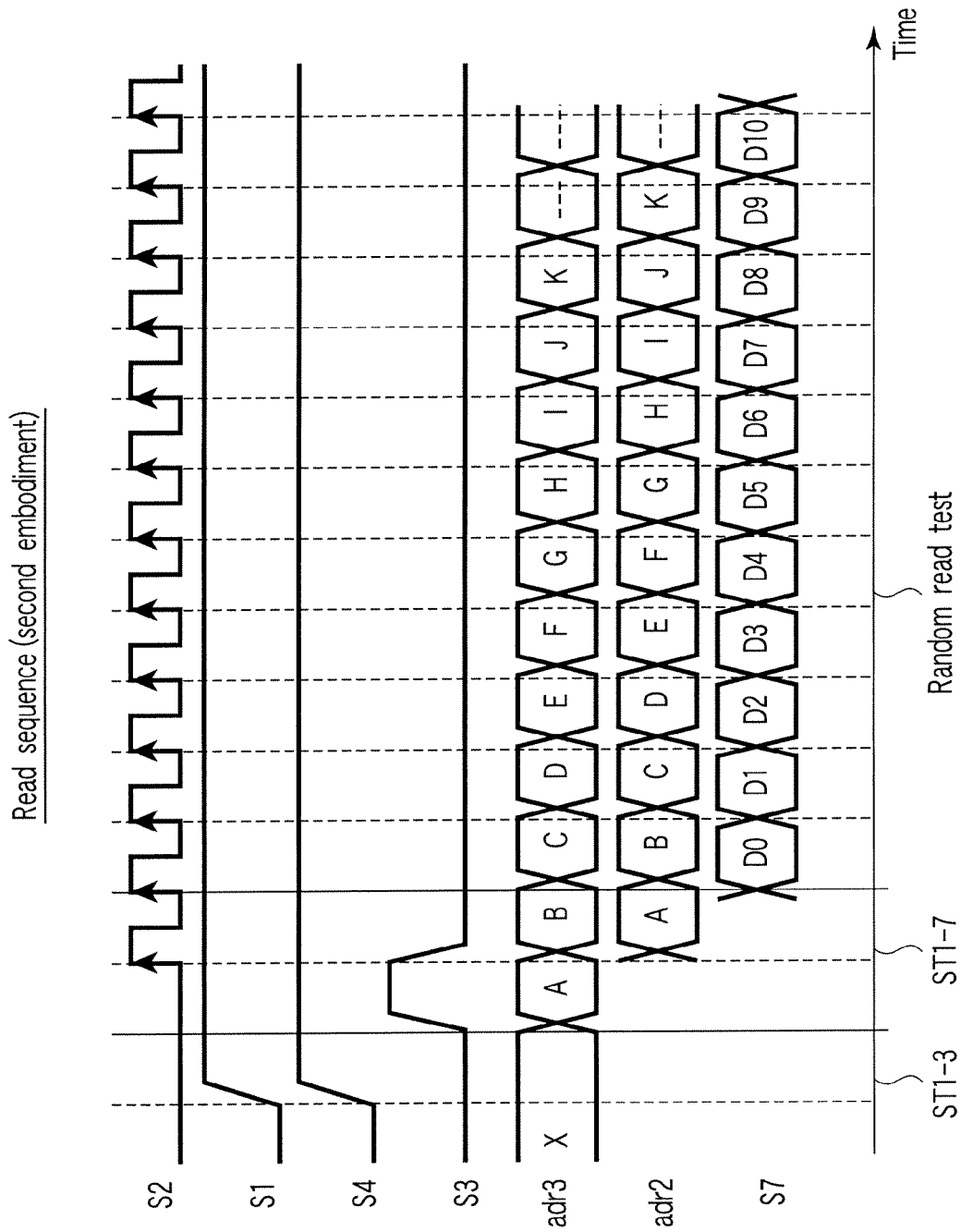
FIG. 10 shows a read sequence of the semiconductor memory device according to the second embodiment.

Next, a description is given of an example of the random read test method of the semiconductor memory device according to this embodiment, referring to a flow chart of FIG. 9 and a read sequence of FIG. 10. The random read test method relates to a read test method which is performed, after step ST1-14, on the basis of the arbitrary address adr4, without using the address counter function of the adder 33 of the sync read control circuit 13.

(Step ST2-1)

To start with, as shown in FIG. 9, the auto-operation control circuit 12 outputs the random read signal S4 and arbitrary address adr4 to the sync read control circuit 13, in sync with the test clock signal S2.

(Step ST2-2)

Subsequently, the sync read control circuit 13 receives the random read signal S4 and arbitrary address adr4.

(Step ST2-3)

Subsequently, the random read signal S4 is input to the control terminal of the selector 28 of the sync read control circuit 13. Accordingly, the selector 28 switches the address that is counted by the adder 33 to the arbitrary address adr4 and outputs the arbitrary address adr4 to the address register 32.

Subsequently, the same steps as in the first embodiment are carried out, and the sync read control circuit 13 controls, upon the input of the random read signal S4, the circuits of the read operation system (self-test implementation, BIST implementation) on the basis of the sync read address adr2, which is generated by the arbitrary address adr4 output from the auto-operation control circuit 12, and which is not the address progressed by the adder 33.

Specifically, the sync read control circuit 13 controls the read control circuit 14 so as to select the address of the flash memory 11 on the basis of the sync read address adr2 that is generated by the arbitrary address adr4, and to start the read operation.

Further, the sync read control circuit 13 controls the read operation sense amplifier circuit 15 so as to sense the memory cell data of the flash memory 11, which is read out in accordance with the sync read address adr2 that is generated on the basis of the arbitrary address adr4, and to send the sensed data as the cell data read signal S5 to the sync read control circuit 13 and selector 22.

(Step ST2-4)

Subsequently, the sync read control circuit 13 outputs, as the cell data, the read circuit test data signal S7 to the determination circuit 16.

(Steps ST2-5 to ST2-8)

Subsequently, the determination circuit 16 executes similar steps ST2-5 to ST2-7, and sends once again the determination result to the sync read control circuit 13.

(Step ST2-9)

Subsequently, the auto-operation control circuit 12 receives the determination result and executes a predetermined process.

With the semiconductor memory device and the test method thereof according to this embodiment, the above-described advantageous effects (1) to (3) can be obtained. Further, according to this embodiment, the following advantageous effect (4) can be obtained.

(4) The random read test can be performed.

As described above, the auto-operation control circuit 12 of this embodiment outputs the random read signal S4 and arbitrary address adr4 to the sync read control circuit 13, in sync with the test clock signal S2 (step ST2-1).

Thus, the selector 28 switches the address, which is counted by the adder 33, to the arbitrary address adr4 and outputs the arbitrary address adr4 to the address register 32. Subsequently, the same steps as in the first embodiment are carried out, and the sync read control circuit 13 controls, upon the input of the random read signal S4, the circuits of the read operation system (self-test implementation, BIST implementation) on the basis of the sync read address adr2, which is generated by the arbitrary address adr4 output from the auto-operation control circuit 12, and which is not the address progressed by the adder 33, thus being able to start the read-out (step ST2-2, ST2-3).

As described above, according to the present embodiment, the read test can advantageously be executed, where necessary, by configuring the read control circuit 14 and read sense amplifier circuit 15 by BIST implementation on the basis of the arbitrary address adr4, and not the address that is progressed by one.

The above embodiments have been described by taking the flash memory (NOR flash memory) as an example of the semiconductor memory. However, the invention is similarly applicable to other semiconductor memories such as a NAND flash memory, an MRAM (Magnetic Random Access Memory) and an FeRAM (Ferroelectric Random Access Memory), and the same advantageous effects can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a semiconductor memory;
an auto-operation control circuit which outputs a clock signal;
a sync read control circuit which outputs a sync read address in sync with the clock signal;
a read control circuit which selects a read address of the semiconductor memory in accordance with an address of the sync read address;
a read sense amplifier circuit which outputs a data read signal that is produced by sensing data that is read out of the semiconductor memory in accordance with the read address;
a determination circuit which compares the data read signal with an expectation value; and
an auto-operation sense amplifier circuit which senses data of the semiconductor memory which is read out in accordance with an auto-operation address that is output from the auto-operation control circuit.

2. The device according to claim 1, wherein the determination circuit comprises:
a first selector which switches and outputs one of a test data signal that is output from the auto-operation sense amplifier circuit, and the test data signal that is output from the sync read control circuit; and
a comparison circuit which compares an output from the first selector with a predetermined expectation value, and outputs a determination result to the auto-operation control circuit.

3. The device according to claim 1, wherein the sync read control circuit controls the read control circuit and the read sense amplifier circuit in a manner to execute a read operation on the basis of the sync read address at a time of a read test, thereby configuring the read control circuit and the read sense amplifier circuit by BIST implementation.

4. The device according to claim 1, further comprising:
a second selector which switches and outputs one of the data read signal that is output from the read sense amplifier circuit and is input to the second selector, and a sync read data signal that is output from the sync read control circuit.

5. The device according to claim 4, further comprising:
an output circuit which converts an output signal from the second selector to an I/O signal.

6. The device according to claim 5, further comprising:
an I/O pad to which the I/O signal from the output circuit is input.

7. The device according to claim 1, further comprising:
a third selector which switches and outputs one of an input non-sync read address and the sync read address.

8. The device according to claim 7, further comprising:
an address pad which is electrically connected to the sync read control circuit and the third selector, and to which one of the non-sync read address and the sync read address is input.

9. The device according to claim 7, wherein the sync read control circuit comprises:
a control circuit which synchronizes, upon receiving the clock signal and the data read signal, the data read signal and outputs the synchronized data read signal, as a read circuit test data signal or a sync read data signal, to a second selector or the determination circuit;
an address register which outputs one of the retained non-sync read address and an auto-operation address, as the sync read address, to the third selector at a timing of reception of the clock signal; and
an adder which executes addition of one to the address that is input from the address register.

10. The device according to claim 1, wherein an auto-operation address is sent from the auto-operation control circuit to the sync read control circuit.

11. The device according to claim 1, wherein an arbitrary address is sent from the auto-operation control circuit to the sync read control circuit.

* * * * *